(12) United States Patent
Litwin et al.

(10) Patent No.: US 6,183,857 B1
(45) Date of Patent: Feb. 6, 2001

(54) SUBSTRATE FOR HIGH FREQUENCY INTEGRATED CIRCUITS

(75) Inventors: Andrej Litwin, Danderyd; Anders Söderbärg, Uppsala, both of (SE)

(73) Assignee: Telefonaktiebolaget LM Ericsson (publ), Stockholm (SE)

( * ) Notice: Under 35 U.S.C. 154(b), the term of this patent shall be extended for 0 days.

(21) Appl. No.: 09/098,515

(22) Filed: Jun. 17, 1998

(30) Foreign Application Priority Data

Jun. 19, 1997 (SE) .................................................... 9702346

(51) Int. Cl.⁷ ........................................................ B32B 5/16
(52) U.S. Cl. ......................... 428/328; 428/331; 428/450; 257/646
(58) Field of Search ..................................... 428/143, 148, 428/209, 210, 450, 689, 698, 328, 331; 438/51, 167, 198, 289, 350, 356, 418, 537, 583, 914; 257/901, 646, 288, 412, 413

(56) References Cited

U.S. PATENT DOCUMENTS

| | | | |
|---|---|---|---|
| 4,827,324 | * 5/1989 | Blanchard | 357/52 |
| 4,901,121 | 2/1990 | Gibson et al. | 357/15 |
| 5,387,555 | 2/1995 | Linn et al. | 437/225 |
| 5,449,642 | * 9/1995 | Tan et al. | 437/200 |
| 5,466,303 | 11/1995 | Yamaguchi et al. | 148/33 |
| 5,605,865 | * 2/1997 | Maniar et al. | 437/200 |
| 5,773,151 | * 6/1998 | Begley et al. | 428/446 |
| 5,780,929 | * 7/1998 | Zeininger et al. | 257/751 |
| 5,854,117 | * 12/1998 | Huisman et al. | 438/379 |

OTHER PUBLICATIONS

Soderbarg, et al., J. Electrochem. Soc., vol. 141, No. 10, "Buried Cobalt Silicid Layers in Silicon Created by Wafer Bonding", pp. 2829–2833, Oct. 1994.

Leon, R.P. et al, "Structrue and thermal stability of Cu–In precipitates and their role in the semi–insulating behavior of InP:Cu", Appl. Phys. Lett. Nov. 23, 1992, pp. 2545–2547.
Wernersson, et al., "GaAs Metalorgaic Vapour Phase Epitaxial Overgrowth over nm–Sized Tunsten Wires", J. Appl. Phys., vol. 34, (1995) pp. 4414–4416. (no month).
Ljungberg, et al., "Buried Cobalt Silicide Layers in Silicon Created by Wafer Bonding", J. Electrochem. Soc., vol. 141, No., Oct. 10, 1994, pp. 2829–2833.
Warren, AC et al., Appl. Phys. Lett. vol. 57, No. 13, "Arsenic Precipitates and the Semi–Insulating Properties of GaAs Buffer Layers Grown by Low–Temperature Molecular Beam Epitaxy" (no date/month).

(List continued on next page.)

Primary Examiner—Deborah Jones
Assistant Examiner—Stephen Stein
(74) Attorney, Agent, or Firm—Burns, Doane, Swecker & Mathis, L.L.P.

(57) ABSTRACT

A silicon substrate material based on silicon has a semi-insulating interior layer isolating the bulk of the substrate material from the top layers, where integrated circuits are to be built. The semi-insulating layer is created by producing submicron particles having Schottky barriers or pn-heterobarriers and distributing the particles so that the depletion regions then produced around neighbouring particles overlap. Such particles will then deplete the silicon material from electric charge carriers. The substrate material can then be processed using the standard silicon processing methods and allows integrated circuits to be manufactured which are suitable for high frequency applications. A silicon substrate is made by sputtering a metal such as Co in a silicon wafer and then silicidizing the sputtered Co atoms by means of an annealing treatment. A top silicon wafer having a silicon dioxide layer at its bottom surface is then bonded to the sputtered layer. Finally the top wafer is thinned to provide a layer thickness suitable for the processing steps required in the manufacture of components.

10 Claims, 1 Drawing Sheet

OTHER PUBLICATIONS

Ho, V. et al., IEEE Transactions on Electron Devices, vol. ed. 29, No. 4, "Fabrication of Si MOSFET's Using Neutron–Irradiated Silicon–Insulating Substrate", pp. 487–491, Apr. 1982.

Hanes, Maurice H., "MICROX©–An All Silicon Technology for Monolithic Microwave Integrated Circuits," *IEEE*, vol 14, No. 5, pp. 219–221, 1993. (no month).

Wernerson, L.E., "Lateral current–constriction in vertical devices using openings buried lattices of metallic discs," *American Institute of Physics*, pp. 2803–2805, Nov. 10, 1997.

Karlin, Tord E., "Process Integration Issues for High–Perfomance Bipolar Technology," *KTH Royal Institute of Technology*, (1997). (no month).

* cited by examiner

US 6,183,857 B1

SUBSTRATE FOR HIGH FREQUENCY INTEGRATED CIRCUITS

This application claims priority under 35 U.S.C. §§119 and/or 365 to 9702346-9 filed in Sweden on Jun. 18, 1997; the entire content of which is hereby incorporated by reference.

The present invention relates to a substrate for building integrated circuits, in particular integrated circuits and components used in integrated circuits which are intended to operate at high frequencies.

BACKGROUND

Common applications within the field of electronic circuits for e.g. use in telecommunication tend to use higher and higher frequencies. Today the frequency range is stretching into the GHz range. At those frequencies the properties of the substrates used for building monolithic integrated circuits become more and more important. Conventionally, semi-insulating substrates based on GaAs have been used for monolithic integrated circuits to be used for processing signals having frequencies within the microwave range, such circuits being called MMIC (=Monolithic Microwave Integrated Circuits) and thus having good signal properties for gigahertz frequencies.

Recently, a similar substrate material called MICROX™ has been proposed by the company Westinghouse for silicon based integrated circuits, see the article by M. H. Hanes et al., "MICROX™—An All-Silicon Technology for Monolithic Microwave Integrated Circuits", Electron Device Letters, Vol. 14, No. 5, May 1993, pp. 219–221. Silicon wafers of the type Silicon on Insulator, SOI, are used comprising high resistivity substrates having an initial resistivity value of about 10 kohmcm. However, it is difficult to produce silicon having such a high resistivity because of the very low impurity concentration required. Moreover, the very manufacturing process of the integrated circuits and components thereof at the substrate surface may lower this resistivity. Still the proposed material is not as good a semi-insulating material as those materials which can be obtained using GaAs or even InP as base materials, what negatively influences the high frequency characteristics of circuits built from such substrates.

In the paper by Vu Quoc Ho and Takauo Sugano, "Fabrication of Si MOSFET's Using Neutron-lrradiated Silicon as Semi-Insulating Substrate", IEEE-TED 24 (4), p. 487 (1982), a method is disclosed for obtaining silicon having a very high resistivity by irradiating silicon with neutrons, the produced material having a resistivity that is unstable during processing for producing integrated circuits.

Some semiconductor materials have been found to have semi-insulating properties, where these properties can be explained as derived from precipitates within the materials acting as or creating "buried" barriers having overlapping depletion regions. For semiconductor materials based on GaAs the precipitates were found to be nano-particles of As, see the paper by Warren, A. C.; Woodall, J. M.; Freeouf, J. L.; Grischkowsky, D.; and others, "Arsenic precipitates and the semi-insulating properties of GaAs buffer layers grown by low-temperature molecular beam epitaxy", Applied Physics Letters, 24 Sep. 1990, Vol. 57, No. 13, pp. 1331–1333, and for materials based on InP Cu—In precipitates were found, see the paper by Leon, R.P.; Werner, P.; Eder, C.; Weber, E. R., "Structure and thermal stability of Cu—In precipitates and their role in the semi-insulating behaviour of InP:Cu", Applied Physics Letters, Nov. 23, 1992, Vol. 61, No. 21, pp. 2545–2547.

SUMMARY

It is an object of the present invention to provide a substrate material suited for common processing methods in the art of integrated circuits based on silicon, in particular suited for manufacturing components which operate at high and very high frequencies, such as within the gigahertz range.

It is a further object of the invention to provide a method of producing a silicon substrate particularly suited for components intended to be operated at high frequencies, but is not restricted to applications using high frequencies and e.g. can be utilised in high voltage devices.

The problem solved by the invention is thus how to provide a silicon substrate for high frequency applications, capable of being produced using standard methods of silicon processing and allowing components to be built in and/at or the surface thereof, also using standard methods of silicon processing, these methods not influencing the basic characteristics of the substrate.

The invention is based on the realization that semi-insulating silicon substrates can be created in a way similar to that used for the III-V-materials, GaAs and InP, as described above, using hetero-junction barriers such as Schottky or pn-hetero-junctions to deplete the silicon material from electric charge carriers, in order to form a material having an extremely high resistivity, comparable to that of semi-insulating GaAs.

Thus, silicon substrates are formed to be used for manufacturing integrated circuits, the substrates having at least one semi-insulating silicon layer formed by including particles having metallic properties and having arbitrary shapes into the layer. The particles can be formed of metals, e.g. W and Mo, metal silicides, e.g. $CoSi_x$, $PtSi_x$, $WSi_x$ and $MoSi_x$, or other materials that form hetero-junctions, e.g. SiC, GaN and AlN, in silicon. The particles should be small, normally having diameters of 1–1000 nm, i.e. be in a submicron range, and should be present in such a density that depletion regions from neighbouring particles overlap each other. The lattice formed by the particles can be substantially two dimensional or three dimensional. A method of embedding matrices of tungsten discs of nm-size in GaAs is disclosed in L.-E. Wernersson, N. Carlsson, B. Gustafsson, A. Litwin, and L. Samuelson: "Lateral current-constriction in vertical devices using openings in buried lattices of metallic disc", Applied Physics Letters, Nov. 10, 1997, Vol. 71, No. 19, pp. 2803–2805. A similar method could possibly also be as used for Si-material.

In U.S. Pat. No. 4,901,121 a semiconductor device comprising a perforated metal silicide layer is disclosed. Such a perforated electrically conductive layer could in some aspects be considered to be equivalent to a layer of electrically conducting particles. However, a semiconductor device comprising such an interior, very well electrically conducting layer is not suited for high-frequency applications since, for electric operation of high frequency, electrical currents will be induced globally in the perforated conducting layer ruining the performance of the semiconductor device. In a layer of particles which are electrically isolated from each other only induced currents can be obtained in the particles resulting in only a very small inductive loss.

Silicon substrates having an interior, stabile semi-insulating layer will obviously be well suited for manufacturing integrated circuits on their surfaces, where the standard and very elaborate and efficient methods for silicon processing can be applied directly, the integrated circuits being well suited for electrical signals having high frequencies since the semi-insulating layer will isolate the circuits from the bulk of the substrate and thus reduce the parasitic capacitances and dielectric losses in the substrate.

The substrate material is thus generally based on silicon and has at least one semiinsulating layer which is based on silicon and which often is an interior layer and it comprises particles having depletion regions around them. To form the semi-insulating layer the particles are distributed in such a way that the depletion regions of neighbouring particles overlap each other. In particular the particles can be made or selected so that the depletion regions are generated by hetero-junctions between the silicon and the particles. Alternatively the particles can be made so that the depletion regions are generated by Schottky barriers between the silicon and the particles.

The particles can for example comprise metal atoms, in particular atoms of molybdenum and/or of tungsten, and/or silicide molecules, such as molecules of a silicide of one or more metals chosen among cobalt, molybdenum, tungsten, titanium, platinum, nickel. The particles can also contain a carbide material such as silicon carbide or a nitride material such as aluminium nitride, gallium nitride, titanium nitride.

The substrate material can then be produced from a silicon plate by producing in a surface layer thereof particles having Schottky barriers or hetero-junctions. The particles are made so that they are distributed in such a way that the depletion regions obtained from the Schottky barriers or the hetero-junctions of neighbouring particles overlap each other. Alternatively the surface layer can be processed or prepared so that such particles can be formed in a later stage, e.g. by heating the material. Then a layer based on silicon, in particular of silicon and/or silicon oxide, is applied on top of the surface layer, so that the top applied layer always is a silicon layer. In the case where the particles have already been produced, the applying operation must be executed so that the Schottky barriers or the hetero-junctions of the particles are not substantially changed. In the case where the surface layer has only been prepared to form the particles, the particles can be formed after or preferably in the applying operation since it will in many cases e.g. comprise a heat treatment or annealing step.

The substrate material can be made to comprise a thicker semi-insulating layer by using, in applying the layer based on silicon, a layer made of only silicon. Then this top silicon layer is thinned and in a surface layer of the thinned silicon layer particles having Schottky barriers or hetero-junctions are formed which are distributed as described above. Alternatively, the surface layer can be processed or prepared, so that such particles can be formed later. Another layer of only silicon is then applied on top of the surface layer, where like above the applying operation is made so that in the case where particles have already been produced the Schottky barriers of the particles are not substantially changed. In the case where the surface layer has only been prepared to form the particles, the particles are formed in or after this step. These steps are repeated until a desired layer thickness has been obtained.

The top layer of silicon can always be thinned to an appropriate thickness for building integrated circuits and electronic components at and/or in this layer.

In producing the particles in the surface layer or preparing to form the particles, the surface of the silicon plate can be sputtered, evaporated, implanted or sprayed with some material that forms a silicide or semiconducting compounds with silicon. The surface layer, in particular all of the plate, is then heated to form said silicide or said semiconducting compounds in the surface layer. In the sputtering, evaporating, implanting or spraying operation, a metal material or a compound thereof can be used, in particular a metal material containing of one or more metals chosen among cobalt, molybdenum, tungsten, titanium, platinum, nickel, more particularly cobalt or a compound thereof. The particles in the surface layer can also be embedded in the substrate during crystal growth of a silicon ingot from which the silicon plate is made.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

DETAILED DESCRIPTION

A silicon substrate having an inner semi-insulating layer is produced using Schottky barriers to deplete the silicon material from electric charge carriers, so that a substrate is obtained having at least one inner layer of an extremely high electrical resistivity. The inner layer is made to include particles having metallic or semiconductor properties. The particles can be formed of metals, silicides or other materials which form suitable Schottky barriers in silicon. The particles can also be formed of semiconducting material forming hetero-junctions to the silicon. The particles are small and have typically diameters of 1–1000 nm. They have such a distribution in the layer that the depletion regions from neighbouring particles overlap each other. The lattice formed by the particles is substantially two-dimensional as for a single layer or is made three-dimensional by arranging several identical layers single layer embodiments of a silicon substrate having a semi-insulating layer will now be described in some detail.

EXAMPLE 1
Si-wafer Having a Buried Semi-insulating Inner Layer

Figure 1:
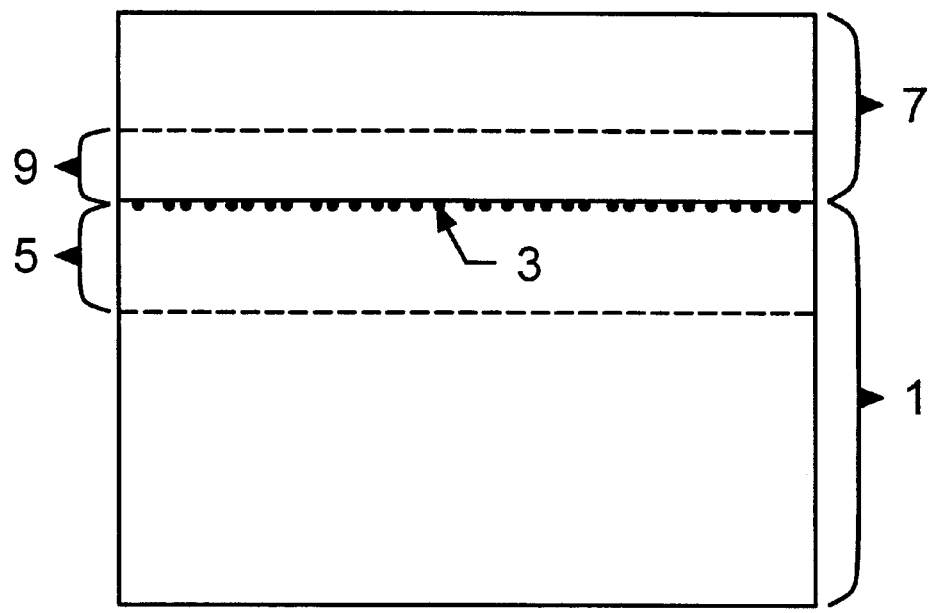
FIG. 1 is a sectional view of a substrate of silicon having a semi-insulating interior layer.

The surface of a Si-wafer 1, e.g. a monocrystalline wafer, see FIG. 1, is sputtered with a suitable material containing cobalt (Co), so that the surface is coated with a very thin Co-film, e.g. having a thickness of less than 100 Å. Thereupon, the surface of the coated layer is silicidized by using an annealing process, subjecting the wafer to a sufficiently high temperature during a suitable time in a suitable ambient atmosphere, as described in the Ph.D. thesis "Process Integration Issues for High-Performance Bipolar Technology" by T. E. Karlin, KTH, Stockholm 1997, ISSN 0284-0545. An alternative way of creating particles is to spray the surface of the wafer with a metal aerosol and then make the silicide. The cobalt silicide thus formed agglomerates in isolated clusters having sizes dependent on the original cobalt layer and the conditions of the annealing process and forms particles 3, having Schotky barriers to silicon. Thus, depletion regions are formed around the particles having extensions dependent on the doping level of the silicon substrate and they extend to the sides and downwards, thus into also a surface layer 5 of the silicon wafer located directly under the layer containing the agglomerates. Another silicon wafer 7 is directly wafer bonded to the first wafer, see e.g. K. Ljungberg, A. Söderbärg, A. Tiensuu, S. Johansson, G. Thunström and S. Petersson, "Buried Cobalt Silicide Layers in Silicon Created by Wafer Bonding", J. Electrochem. Soc. 141 (10), p. 2829, 1994. The top wafer 7 is then thinned to have a thickness suitable for manufacturing components and integrated circuits therein and thereat. The depletion regions from Schottky barriers of the particles will then extend also upwards, towards the surface of the added thinned silicon layer 7, which will accommodate the electronic devices, not shown, and in particular they extend into a bottom layer 9 of top, thinned silicon layer. The semi-insulating layer 5+9, formed by the Schottky barriers of the particles, may or may not reach the top surface of the upper thinned wafer 7 depending on the components to be manufactured.

To increase the bond strength between the two wafers 1, 7 it can be necessary to add an annealing step after the very bonding of the wafers to each other, the annealing being made at a suitable temperature, for a selected time period and in ambient atmosphere. It is therefore also possible to form the clusters of silicide or hetero-junctions during that annealing step instead of forming them, as has been described above, before the wafers are bonded to each other.

EXAMPLE 2

SOI wafer

Figure 2:
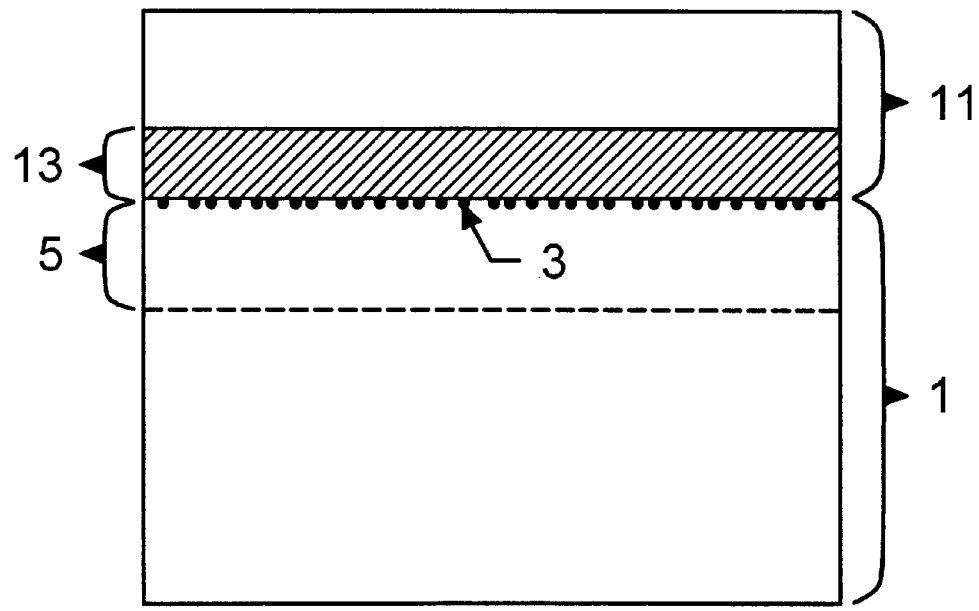
FIG. 2 is a sectional view of an isolating SOI substrate having a semi-insulating interior layer.

The surface of a Si wafer 1, e.g. a monocrystalline wafer, see FIG. 2, is sputtered with a suitable material containing cobalt (Co), so that the surface is coated with a very thin Co-film 3, e.g. having a thickness of less than 100 Å. Thereupon, the surface of the coated layer is silicidized by using an annealing process, subjecting the wafer to a sufficiently high temperature during a suitable time in a suitable atmosphere. The cobalt silicide thus formed agglomerates in isolated clusters having sizes dependent on the applied cobalt layer and the conditions used in the annealing process. Then particles are formed having Schottky barriers which result in depletion regions, the extension of which depend on the doping level of the silicon material used. The depletion regions extend to the sides and downwards, thus into also a surface layer 5 of the silicon wafer located directly under the layer containing the agglomerates. Another silicon wafer 11 having a thin SiO$_2$-layer 13 on one of its surfaces is directly wafer bonded to the first wafer, the SiO$_2$-layer 13 then being bonded to the silicidized layer 3, see the cited article by Ljungberg et al. The top wafer 11 will thus have its silicon part directed upwards and this layer is then thinned to have a thickness suitable for manufacturing components and integrated circuits therein and thereat.

The general advantage of example 2 is the DC isolation provided by SiO$_2$-film 13 between the device layer 11 and the substrate 1.

Variations of the geometry of the structure as described in Example 2, where an inner layer of a dielectric material, i.e. the silicon dioxide layer, is placed directly on top of the semi-insulating silicon layer and is placed underneath a thinned silicon layer, could be that the semi-insulating layer is located on the thinned side of the final composite wafer, i.e. between the thinned silicon layer and the dielectric layer, or even that semi-insulating layers are placed on both sides of a buried oxide.

Another method of embedding metallic particles in a silicon layer comprises epitaxial growth. This method has been demonstrated for GaAs, see L.-E. Wernersson, K. Georgsson, A. Litwin, L. Samuelson and W. Seifert, "GaAs Metalorganic Vapour Phase Epitaxial Overgrowth over nm-Sized Tungsten Wires", Jpn. J. Appl. Phys. Aug. 34,1995, p. 4419. The end result is similar to the above described wafer bonded silicon substrate.

Another method to form particles or clusters of materials inside the silicon is by ion-implantation of the material. The implantation will then create an amorphosized silicon zone buried in the monocrystalline silicon wafer and having a high concentration of the implanted material. By a post-annealing operation made after the implantation has been made, the implanted material can diffuse and form clusters with heterojunctions or metallic properties to the surrounding silicon.

To form a thicker semi-insulating layer in a silicon wafer having a threedimensional lattice of suitable particles the above described steps of either wafer bonding or epitaxy can be repeated for a number of times until the required thickness is achieved, the method then comprising making a layer having agglomerates at the top of a base silicon wafer, applying a top silicon wafer, thinning the silicon top wafer to have thickness of e.g. about twice the thickness of the top layer 5 of FIGS. 1 and 2, making a layer having agglomerates at the top of the thinned silicon layer, applying a new top silicon wafer, etc., the final step being applying either a silicon wafer or a silicon wafer having an oxide layer at its bottom surface and finally thinning the top silicon layer to a thickness suitable for building components.

Another method of forming a thick semi-insulating substrate is to embed particles as specified above during the crystal growth of the original silicon ingot from which the wafers are produced.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. A substrate material comprising a semi-insulating layer comprising silicon and particles embedded in the silicon, the particles having depletion regions around them and being so distributed that the depletion regions of neighboring particles overlap each other.

2. The substrate material of claim 1, wherein the particles are so selected that the depletion regions around the particles are generated by hetero-junctions between the silicon and the particles.

3. The substrate material of claim 1, wherein the particles are so selected that the depletion regions around the particles are generated by Schottky barriers between the silicon and the particles.

4. The substrate material of claim 1, wherein the particles comprise at least one selected among metal atoms and silicide molecules.

5. The substrate material of claim 1, wherein the particles contain a silicide of at least one metal chosen among cobalt, molybdenum, tungsten, titanium, platinum, and nickel.

6. The substrate material of claim 1, wherein the particles contain atoms of at least one of molybdenum and tungsten.

7. The substrate material of claim 1, wherein the particles contain carbide.

8. The substrate material of claim 1, further comprising a silicon wafer, on top of which the semi-insulating layer is located.

9. The substrate material of claim 1, comprising a silicon oxide layer on the surface of a top wafer, the surface of the silicon oxide layer being bonded to the semi-insulating layer.

10. The substrate material of claim 1, wherein the particles contain at least one of silicon carbide, aluminum nitride, gallium nitride, and titanium nitride.

* * * * *